United States Patent
Lee et al.

(10) Patent No.: US 11,961,546 B2
(45) Date of Patent: Apr. 16, 2024

(54) MRAM REFERENCE CURRENT

(71) Applicant: Taiwan Semiconductor Manufacturing Company, Ltd., Hsinchu (TW)

(72) Inventors: Chia-Fu Lee, Hsinchu (TW); Hon-Jarn Lin, Hsinchu (TW); Po-Hao Lee, Hsinchu (TW); Ku-Feng Lin, Hsinchu (TW); Yi-Chun Shih, Hsinchu (TW); Yu-Der Chih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 160 days.

(21) Appl. No.: 17/391,639

(22) Filed: Aug. 2, 2021

(65) Prior Publication Data

US 2021/0358532 A1    Nov. 18, 2021

Related U.S. Application Data

(62) Division of application No. 16/431,158, filed on Jun. 4, 2019, now Pat. No. 11,081,155.

(60) Provisional application No. 62/686,432, filed on Jun. 18, 2018.

(51) Int. Cl.
  *G11C 11/06*    (2006.01)
  *G11C 11/08*    (2006.01)
  *G11C 11/16*    (2006.01)
  *H10B 61/00*    (2023.01)
  *H10N 50/10*    (2023.01)

(52) U.S. Cl.
  CPC ........ *G11C 11/1675* (2013.01); *G11C 11/161* (2013.01); *G11C 11/1655* (2013.01); *G11C 11/1657* (2013.01); *G11C 11/1673* (2013.01); *H10B 61/22* (2023.02); *H10N 50/10* (2023.02)

(58) Field of Classification Search
  CPC .............. G11C 11/1675; G11C 11/161; G11C 11/1655; G11C 11/1657; G11C 11/1673; G11C 11/1697; H01L 27/228; H01L 43/08
  See application file for complete search history.

(56) References Cited

U.S. PATENT DOCUMENTS

| | | | |
|---|---|---|---|
| 6,822,895 B2 | 11/2004 | Yamada | |
| 8,587,994 B2 | 11/2013 | Kim et al. | |
| 8,687,412 B2 | 4/2014 | Chih et al. | |
| 9,142,293 B2 | 9/2015 | Hatsuda | |
| 9,281,039 B2 | 3/2016 | Jung et al. | |
| 9,799,639 B2 | 10/2017 | Chao et al. | |
| 9,812,205 B2 | 11/2017 | Ghosh et al. | |
| 10,319,423 B2 * | 6/2019 | Lee ........................ | G11C 7/062 |

(Continued)

FOREIGN PATENT DOCUMENTS

| CN | 1396598 A | 2/2003 |
|---|---|---|
| CN | 103140895 A | 6/2013 |

(Continued)

*Primary Examiner* — Hien N Nguyen
(74) *Attorney, Agent, or Firm* — Merchant & Gould P.C.

(57) ABSTRACT

A reference circuit for generating a reference current includes a plurality of resistive elements including at least one magnetic tunnel junction (MTJ). A control circuit is coupled to a first terminal of the at least one MTJ and is configured to selectively flow current through the at least one MTJ in the forward and inverse direction to generate a reference current.

20 Claims, 10 Drawing Sheets

(56) References Cited

U.S. PATENT DOCUMENTS

| | | | |
|---|---|---|---|
| 11,081,155 B2 * | 8/2021 | Lee | G11C 11/161 |
| 2011/0157971 A1 | 6/2011 | Kim et al. | |
| 2013/0258762 A1 | 10/2013 | Chih et al. | |
| 2014/0160833 A1 | 6/2014 | Yamaoka et al. | |
| 2014/0269030 A1 | 9/2014 | Chih et al. | |
| 2016/0027488 A1 | 1/2016 | Kim | |
| 2016/0343421 A1 | 11/2016 | Pyo | |
| 2017/0345496 A1 | 11/2017 | Liu et al. | |
| 2018/0151211 A1 * | 5/2018 | Lee | G11C 7/062 |

FOREIGN PATENT DOCUMENTS

| | | |
|---|---|---|
| CN | 105659327 A | 6/2016 |
| CN | 108122567 A | 6/2018 |
| KR | 10-2011-0078181 A | 7/2011 |
| KR | 10-2014-0111912 A | 9/2014 |

\* cited by examiner

MRAM REFERENCE CURRENT

CROSS-REFERENCE TO RELATED APPLICATION

This application is a Division of U.S. patent application Ser. No. 16/431,158, filed Jun. 4, 2019, the disclosure of which is hereby incorporated herein by reference in its entirety and claims priority to U.S. Provisional Patent Application No. 62/686,432, filed Jun. 18, 2018, the disclosure of which is hereby incorporated by reference in its entirety.

BACKGROUND

Memory devices are used to store information in semiconductor devices and systems. A nonvolatile memory device is capable of retaining data even after power is cut off. Examples of nonvolatile memory devices include flash memory, ferroelectric random access memories (FRAMs), phase-change random access memories (PRAMs), and magnetic random access memories (MRAMs). MRAMs store data using variations in the magnetization direction at tunnel junctions. The two states of an MRAM cell can be sensed from their relatively higher or lower resistances (RH and RL), which represent different binary logic values of a bit stored in the memory. For example, RL (or high cell current) may be designated as a logical "0" ("Data-0"); RH (or low cell current) may be designated as a logical "1" ("Data-1"). A bit of data, a logic "0" or "1" value, stored in a MRAM memory cell can be determined by comparing a current that flows through the memory cell to a reference current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
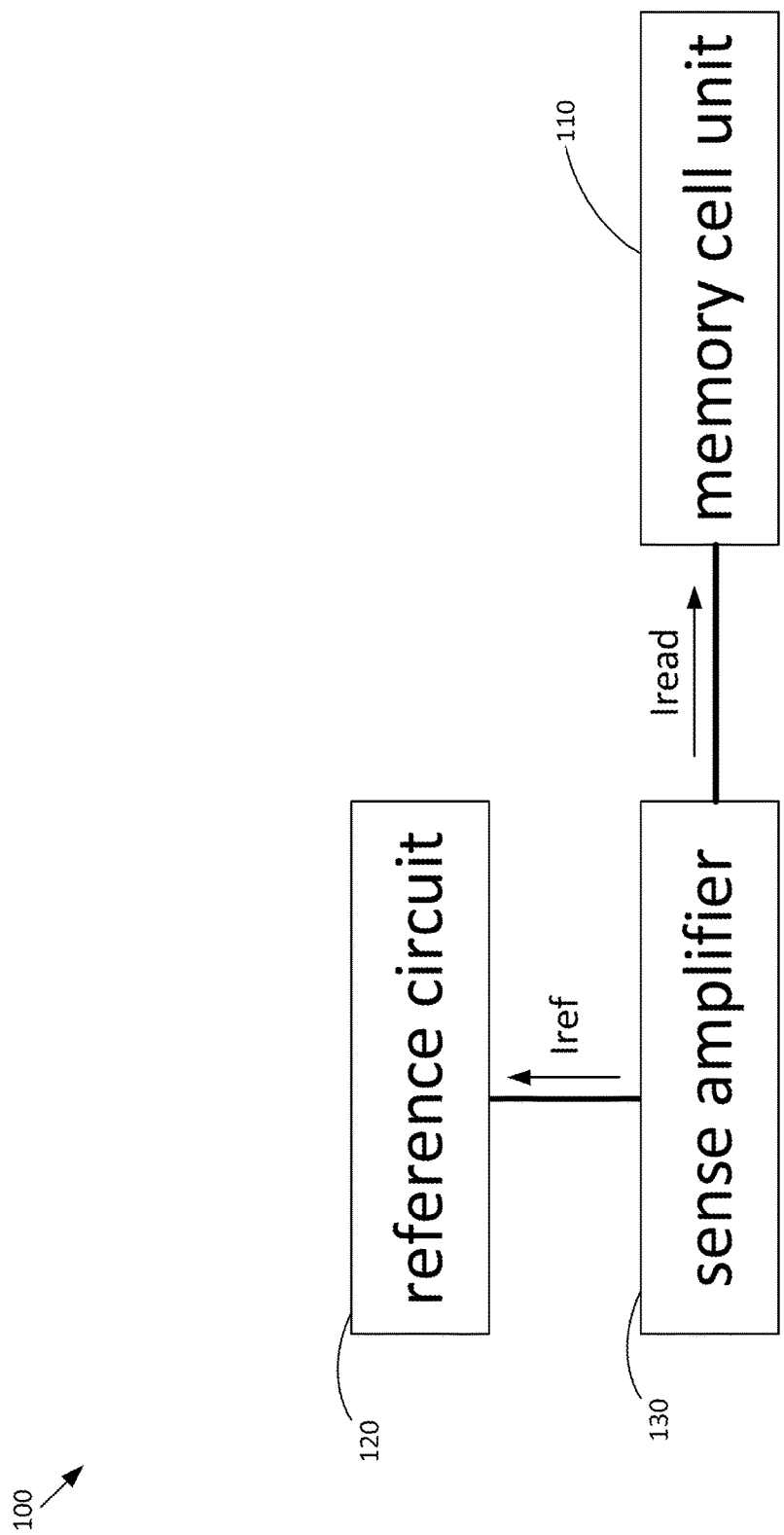
FIG. 1 is a block diagram generally illustrating an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Certain types of memory devices, such as MRAM, have two or more resistance states depending on the state of magnetization alignment between two or more layers of magnetic materials, such as ferromagnetic materials. The resistance of a memory cell can be compared to a reference to determine the resistance state of the memory cell. As the density of memory cells increases, the requirement for proper setting of the reference relative to the memory cells becomes more stringent.

More particularly, MRAM stores data at memory cells having two superimposed layers of magnetic material separated by a thin insulating film. The layered structure forms a magnetic tunnel junction ("MTJ" or "MTJ element") of an MRAM cell. The two layers include a magnetic layer that is permanently magnetized in a fixed magnetic field alignment direction (this layer is referred to as a "pinned layer") and a changeably-magnetized magnetic layer (this layer is referred to as a "free layer"). The free layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel) or opposite to that of the permanent magnet layer (anti-parallel). The parallel alignment state has a relatively lower resistance and the anti-parallel alignment state has a higher resistance.

FIG. 1 is a block diagram generally illustrating an example memory device 100 in accordance with some embodiments. In the example shown, the memory device 100 includes a memory cell array 110, a reference circuit 120, and a sense amplifier 130 connected to the memory cell array 110 and the reference circuit 120. The memory cell array 110 includes one or more memory cells arranged in rows and columns, described below in more detail relative to FIG. 2. In some embodiments, the memory device 100 is a non-volatile memory device, including, e.g., a magnetoresistive random access memory (MRAM). In other embodiments, the memory device 100 is a volatile memory device. In certain embodiments, the memory device 100 is a read-only memory device. The memory cell array 110 includes at least one memory cell configured to store a bit logic "0" or "1" value of data therein and to allow a read current (Iread) to flow therethrough. Although the read current (Iread) is exemplified in FIG. 1 as flowing from the sense amplifier 130 to the memory cell array 110, the read current (Iread) may flow from the memory cell array 110 to the sense amplifier 130.

In a read operation, for example, read voltages are applied to the memory device 100, whereby a read current (Iread) flows between the memory cell array 110 and the sense amplifier 130 and a reference current (Iref) flows between the reference circuit 120 and the sense amplifier 130. The levels of the currents (Iread, Iref) are dictated by the resistances of the respective memory cell array 110 and the reference circuit 120. The sense amplifier 130 compares the read current (Iread) to the reference current (Iref) to sense a bit logic "0" or "1" value of data stored in a memory cell of the memory cell array 110. When it is determined that the read current (Iread) is less than the reference current (Iref), the sense amplifier 130 senses a logic "1" value. Conversely, when it is determined that the read current (Iread) is greater than the reference current (Iref), the sense amplifier 130 senses a logic "0" value. The sense amplifier 130 amplifies the level of that sensed bit of data and provides the amplified bit of data as an output, such that the bit of data can be read from the memory cell. In some embodiments, the sense amplifier 130 is a differential sense amplifier. In other embodiments, the sense amplifier 130 is a single ended sense amplifier.

Figure 2:
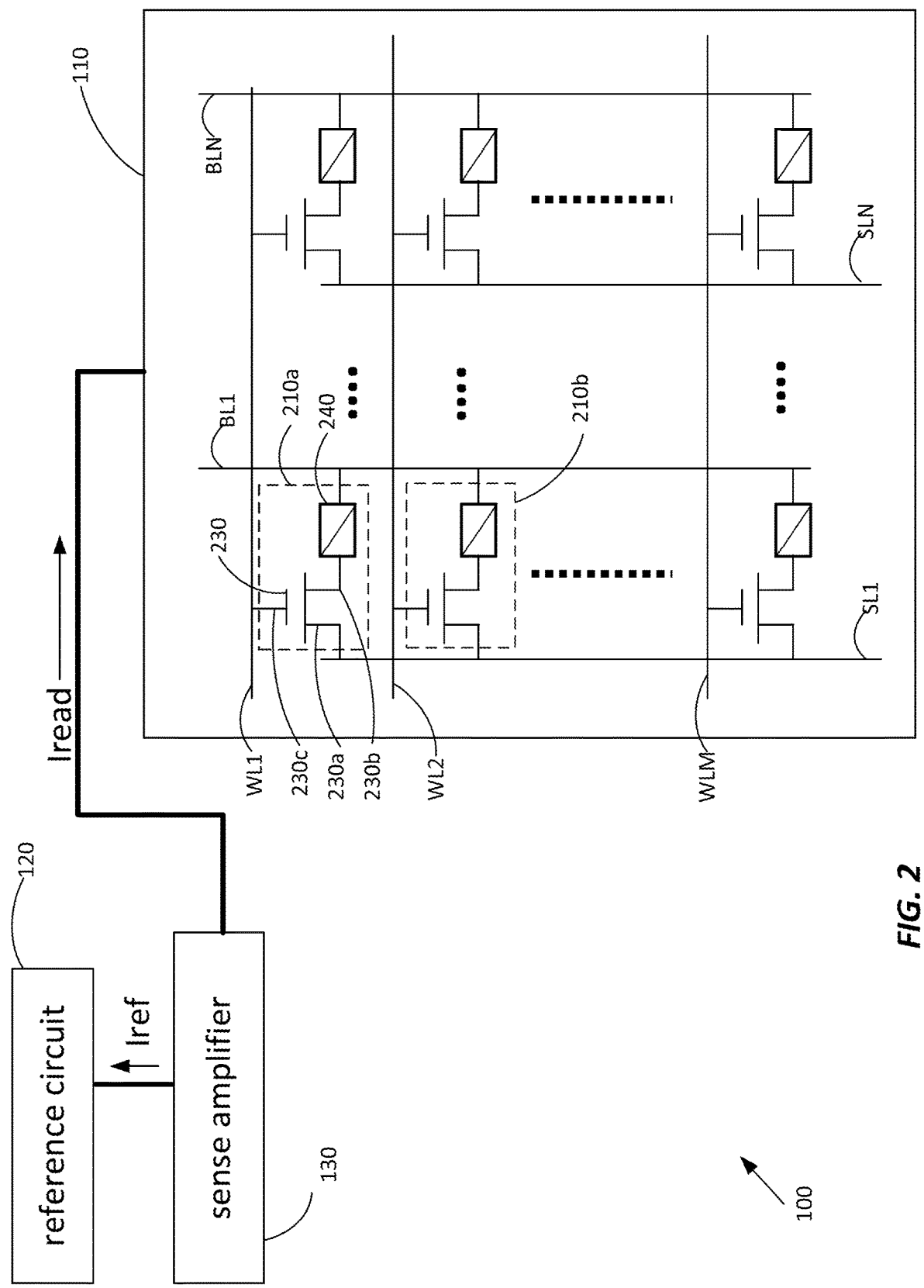
FIG. 2 is a circuit diagram illustrating an example array of magnetic random access memory cells in a memory device in accordance with some embodiments.

FIG. 2 is a circuit diagram illustrating an example array of magnetic random access memory cells in a memory device in accordance with some embodiments. In the example shown, the memory cell array 110 includes a plurality of the memory cells 210 arranged in an array of rows and columns. For clarity of illustration, only two of the memory cells 210 are labeled in FIG. 2, i.e., one of the memory cells in the first row labeled as 210a and one of the memory cells in the second row labeled as 210b.

As illustrated in FIG. 2, the memory device 100 further includes a plurality of word lines (WL1, WL2, WLM, etc.), bit lines (BL1, BLN, etc.), and source lines (SL1, SLN, etc.). The word line WL1 connects the memory cells 210 in the first row, the word line WL2 connects the memory cells 210 in the second row, and the word line WLN connects the memory cells 210 in the Nth row. The bit line BL1 and the source line SL1 connect the memory cells 210a, 210b, etc., in the first column, and the bit line BLN and the source line SLN connect the memory cells 210 in the Nth column. Therefore, in the example shown, the memory cell array 110 includes M rows, N columns, and M×N memory cells 210. The bit lines BL1, BLN, etc., can be selectively connected to the sense amplifier 130 via switches (not shown) depending on exactly which memory cell in the array is to be read to or written from.

Because the memory cells 210 are the same in construction and operation, only one, i.e., the memory cell 210a, will be described here. In this embodiment, the memory cell 210a includes a transistor 230 and a resistive element 240.

The transistor 230 can be a field-effect transistor (FET), e.g., a metal-oxide semiconductor FET (MOSFET), and includes a first source/drain terminal 230a connected to the source line SL1, a second source/drain terminal 230b, and a gate terminal 230c connected to the word line WL1. In an alternative embodiment, the memory device 100 does not include the source line SL. In such an alternative embodiment, the first source/drain terminal 230a of the transistor 230 is connected to a ground or other node of the memory device 100. The transistor 230 may be any type of transistor, including, e.g., a junction-type transistor, such as a bipolar junction transistor (BJT).

The resistive element 240 is connected between the second source/drain terminal 230b of the transistor 230 and the bit line BL1. In some embodiments, the resistive element 240 is an MTJ. The resistive element 240 may be any type of resistive element or circuit so long as it achieves the intended function described herein.

In a write operation, for example, write voltages are applied to the bit line BL1, the source line SL1, and the word line WL1. A voltage applied to the word line WL1 activates the transistor 230 and a write current flows through the memory cell 210a. That write current flows through the MTJ 240, causing the MTJ 240 to switch from a parallel state to an anti-parallel state or vice versa, whereby a bit of data is written and stored in the memory cell 210a. When it is desired to switch the MTJ 240 from the anti-parallel state to the parallel state to store a "0" value, a switch current is passed through the MTJ 240 from the free layer to the reference layer. Conversely, when it is desired to switch the MTJ 240 from the parallel state to the anti-parallel state to store a "1" value, a switch current is passed through the MTJ 240 from the reference layer to the free layer.

When the free layer of the MTJ 240 is in the parallel state, the MTJ 240 exhibits a low resistance that represents a logic "0" value and the MTJ 240 is said to be in a parallel state or a low resistance state. Conversely, when the free layer is in the anti-parallel state, the MTJ 240 exhibits a high resistance that represents a logic "1" value and the MTJ 240 is said to be in an anti-parallel state or a high resistance state. In some embodiments, the logic represented by the MTJ 240 in a high or low resistance state is arbitrary, e.g. the logic "1" can be represented by the MTJ 240 in a low resistance state and the logic "0" can be represented by the MTJ 240 in a high resistance, and is determined by the desired convention used for the memory device. Whichever convention is chosen, the MTJ 240 can store binary data via two writeable and readable states, e.g. the high resistance and low resistance states. For purposes of consistency, embodiments described herein will use the convention that the MTJ 240 in the low resistance state represents a "0" and the MTJ 240 in the high resistance state represents a "1," unless otherwise stated.

In some embodiments, the reference circuit 120 is configured to generate a reference current (Iref), e.g., 25 uA. Although the reference current (Iref) is illustrated as flowing from the sense amplifier 130 to the reference circuit 120, the reference current (Iref) may flow from the reference circuit 120 to the sense amplifier 130.

In a read operation, for example, read voltages are applied to the bit line BL and the source line SL associated with a column of a selected memory cell 210 to be read, as well as the word line WL associated with a word of a selected bit to be read. For example, read voltages can be applied to the bit line BL1, the source line SL1, and the word line WL1 to read the bit stored in the memory cell 210a. To select other cells, different combinations of bit lines, source lines, and word lines are activated to produce a read current indicative of the data stored at the respective cell.

In the example shown, when the memory cell 210a is read, a read current (Iread) flows through the resistive element 240, e.g. MTJ 240. The magnitude of the read current (Iread) corresponds to a resistance state of the MTJ 240. For example, when the MTJ 240 is in a low resistance state, i.e., a parallel state, the read current (Iread) will be greater than the reference current (Iref). This indicates that the memory cell 210a stores a bit logic "0" value of data therein. Conversely, when the MTJ 240 is in a high resistance state, i.e., an anti-parallel state, the read current (Iread) will be less than the reference current (Iref), indicating that the memory cell 210a stores a bit logic "1" value of data therein. The sense amplifier 130 can compare the read current (Iread) to the reference current (Iref) to sense a bit logic "0" or "1" value of data stored in the memory cell 210a. The sense amplifier 130 amplifies a level of the sensed bit of data and outputs the amplified bit of data such that the bit of data stored in the memory cell 210a can be read therefrom.

In order for the sense amplifier 130 to accurately sense the bit of data stored in the memory cells 210, the amount of the reference current (Iref) should be between the amount of a read current (Iread) when the MTJ 240 is in the parallel state and the amount of a read current (Iread) when the MTJ 240 is in the anti-parallel state. It should be understood that an MTJ is susceptible to temperature and process variations. As such, in order for the reference circuit 120 to generate such a reference current (Iref), in some embodiments, the reference circuit 120 includes a resistive element that is of the same type as the resistive element 240 of the memory cells 210, for example, at least some of the resistive elements of the reference circuit 120 are MTJs of the same type as the MTJs 240 of the memory cells 210. This allows the reference circuit 120 to track temperature and process variations of the resistive elements 240 of the memory cells 210. A voltage or current source that generates constant reference voltages or currents is not capable of tracking temperature and process variations of an MTJ.

In some embodiments, prior to operation of the reference circuit 120, the MTJ resistive elements of the reference circuit 120 are first switched to an anti-parallel state. The anti-parallel, e.g. high resistance, state produces a reference current that is of a lesser magnitude than implementations that route the reference current through MTJ resistive elements in the parallel state. By routing the reference current through a combination of one or more MTJs in an anti-parallel state, a reference current (Iref) can be generated having a magnitude between the magnitude of the read current (Iread) when the memory cell contains a "0" data value and the magnitude of the read current (Iread) when the memory cell contains a "1" data value.

Figure 3:
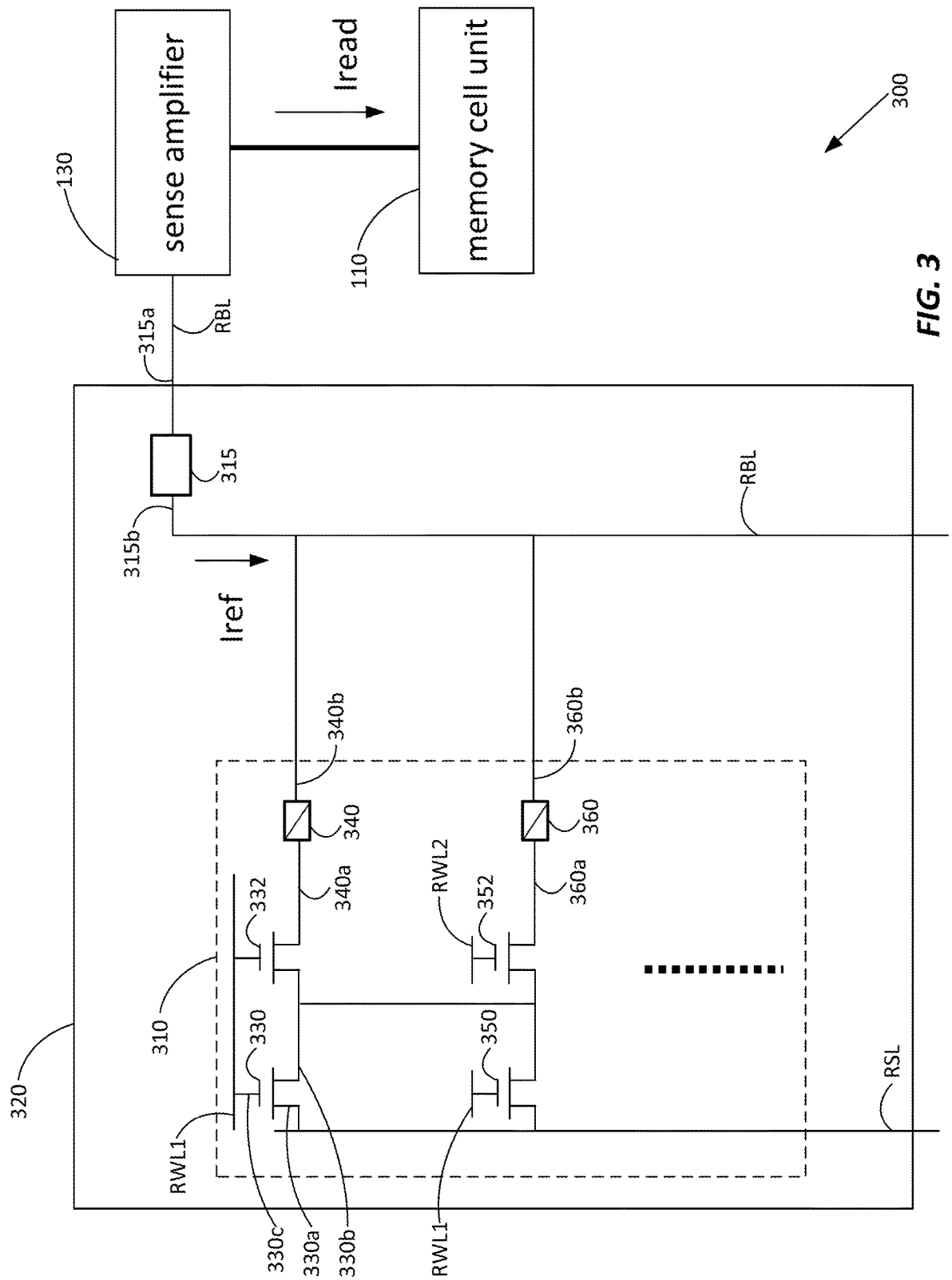
FIG. 3 is a circuit diagram illustrating an example reference circuit of a memory device in accordance with some embodiments.

FIG. 3 is a circuit diagram illustrating an example reference circuit 320 of a memory device 300 in accordance with some embodiments. The reference circuit 320 includes an MTJ circuit 310 and a resistor 315 (e.g., a single resistor, an arrangement of resistors, or other circuitry that provides a resistive contribution to a circuit). The memory device 300 further includes a plurality of reference word lines, e.g. RWL1, RWL2, etc., a reference bit line RBL, and a reference source line RSL.

In the illustrated embodiment, the reference circuit 320 includes the resistive elements 340 and 360, e.g. MTJs 340 and 360, and the resistor 315. A control circuit 310 includes the transistors 330, 332, 350, and 352, and is configured to selectively control current flow through the MTJs 340 and 360 in the forward and inverse direction to generate a reference current. The embodiment shown also includes the reference source line RSL, and the reference word lines RWL1 and RWL2. Although the example illustrates four transistors and two MTJs, other embodiments can user fewer or more transistors and MTJs. In general, the MTJ circuit 310 can include 2I transistors, I resistive elements, and I reference word lines, where I is an integer that is typically two or greater and corresponds to the number of MTJs selected in order to generate a desired reference current (Iref). The reference current (Iref) generated by reference circuit 320 is based on the sum of currents flowing through the arrangement of the MTJs included in the reference circuit 320, e.g., the I MTJs arranged in series, parallel, or a combination of series and parallel. Thus, the resistive elements can be arranged so as to produce the desired reference current (Iref), for example, a current that is between the read current (Iread) generated by a stored "0" value versus a stored "1" value in the memory cells 210 of the memory cell array 110.

In the example shown, the first transistor 330 has a first source/drain terminal 330a connected to the reference source line RSL, a second source/drain terminal 330b connected to a source/drain terminal of each of the transistors 332, 350, and 352, and a gate terminal 330c connected to the first reference word line RWL1. The second transistor 332 has a first source/drain terminal connected to the source/drain terminals of the transistors 330, 350, and 352, a second source/drain terminal connected to the first terminal 340a of the MTJ 340, and a gate terminal connected to the first reference word line RWL1 Similarly, the third transistor 350 has a first source/drain terminal connected to the reference source line RSL, a second source/drain terminal connected to a source/drain terminal of each of the transistors 330, 332, and 352, and a gate terminal connected to the first reference word line RWL1. The fourth transistor 352 has a first source/drain terminal connected to the source/drain terminals of the transistors 330, 332, and 350, a second source/drain terminal connected to the first terminal 360a of the MTJ 360, and a gate terminal connected to the second reference word line RWL2. The resistor 315 has a first terminal 315a connected to the bit line RBL and a second terminal 315b connected to the second terminals 340b and 360b of the MTJs 340 and 360. In some embodiments, where I is greater than two, the additional transistors and MTJs will be similarly connected. For example, for I=3, a fifth transistor would have its source/drain pair connected between the source line RSL and the other transistors, and a gate connected to the first word line RWL1, and the sixth transistor would have its source/drain pair connected between the other transistors and the first terminal of a third MTJ, and a gate connected to a third word line RWL3 (not shown for simplicity).

In an alternative embodiment, the memory device 300 does not include the reference source line RSL. In such an alternative embodiment, the first source/drain terminal 330a of the transistor 330, and the first source/drain terminal of the transistor 350, can be connected to ground or other node of the memory device 100. The transistors of the reference circuit 320, for example the transistors 330, 332, 350, and 352, can be any type of transistor, including, e.g., a junction-type transistor, such as a BJT.

In the example shown, the MTJs 340 and 360 are of the same type as the MTJs 240 included in the memory cells 210 of the memory cell array 110. Further, the MTJs 340 and 360 are in an anti-parallel state. In the embodiment shown, the MTJs 340 and 360 are connected in parallel and their resistances add in parallel. For example, for MTJs 340 and 360 each having a resistance in the anti-parallel state of Rap, the total resistance of the MTJs 340 and 360 connected in parallel as shown in the example is Rap/2. In the example shown, the MTJs 340 and 360 are connected in series with the resistor 315 such that the total resistance of the MTJs 340 and 360, e.g Rap/2, adds in series with the resistance of the resistor 315. The resistor 315 has a substantially constant resistance, e.g. R. In some embodiments, the resistor 315 has a resistance of about half of the resistance of the MTJs 340 and 360 in the parallel state. For example, for the MTJs 340 and 360 each having a resistance in the parallel state of Rp, the resistor 315 can have a resistance about half of Rp, e.g. about Rp/2.

In the embodiment shown, the first transistor 330, the second transistor 332, the third transistor 350, and the fourth transistor 352 are substantially the same, and as such have substantially the same resistance, $R_T$, for a given voltage applied to their respective gates. As illustrated, the first transistor 330 and the third transistor 350 are connected in parallel, resulting in a resistance of $R_T/2$ for a given voltage applied to the gates of both the first transistor 330 and the second transistor 350, e.g. via the reference word line RWL1 The second transistor 332 and the fourth transistor 352 are also connected in parallel, also resulting in a resistance of $R_T/2$ for a given voltage applied to the gates of both the second transistor 332 and the fourth transistor 352, e.g. via the reference word lines RWL1 and RWL2, respectively. Further, the first pair of transistors, e.g. the first transistor 330 and the third transistor 350, are connected in series with the second pair of transistors, e.g. the second transistor 332 and the fourth transistor 352. As such, the resistances of the four transistors 330, 332, 350, and 352 result in $R_T$, which mimics the resistance of any one of the four transistors 330, 332, 350, or 352 individually. Connecting the four transistors 330, 332, 350, and 352 to the two MTJs 340 and 360 as shown in the example creates individually addressable, e.g. controllable, write current paths to each of the MTJs 340 and 360, as will be described below in further detail with reference to FIG. 4. Typically, when the transistors 330, 332, 350 and 352 are activated, e.g a voltage greater than the threshold voltage is applied to their gates, the resistance of the transistors 330, 332, 350, and 350 is low, and in some embodiments is low enough so as to be negligible, e.g. $R_T$ is low and can be negligible. In some embodiments, when a voltage is not applied to the gates of the transistors 330, 332, 350 and 352, the resistance of those transistors can be high, and in some embodiments high enough to stop the flow of current through the respective transistor, e.g. $R_T$ is high.

In the example shown, the MTJs 340 and 360 are connected in parallel with respect to each other, and in series with both the resistor 315 and the four transistors 330, 332, 350, and 352. The reference current (Iref) is determined by the voltage applied to the reference circuit 320 and the total of the resistance of the reference circuit 320 along the current path. In other words, the reference current (Iref) is proportional to the resistance of the transistors 330, 332, 350, and 352 connected in parallel, e.g. $R_T$, the resistance of the resistive elements 340 and 360 connected in parallel, e.g. Rap/2, and the resistance of the resistor 315, e.g. R. As such, the total resistance of the reference circuit 320 in the example shown is Rtot=$R_T$+Rap/2+R. In some embodiments, the resistance of the MTJs 340 and 360 can change with temperature and process variations in the same manner as the MTJs 240 of the memory cell array 110. As such, the reference MTJs 340 and 360 can track, or mimic, the resistance variations of the memory cell MTJs 240. The resistance of the resistor 315 can be chosen so as to result in a total resistance of the reference circuit 320 that results in a desired reference current (Iref) that is between the read current (Iread) from a memory cell MTJ 240 in the low or high resistance state. In some embodiments, the resistor 315 can be a polysilicon resistor.

In an example read operation of the memory cell 210a (shown in FIG. 2) using the reference circuit 320, read voltages are applied to the bit line BL1, the source line SL1, and the word line WL1 of the memory cell array 110. This activates the transistor 230 and a read current (Iread) flows through the memory cell 210a. Referring back to FIG. 3, reference read voltages are applied to the reference bit line RBL, the reference source line RSL, and reference word line voltages are applied to all of the reference word lines of the reference circuit 320, e.g. RWL1 and RWL2 in the example shown. This activates the transistors 330, 332, 350 and 352, and the reference circuit 320 generates a reference current (Iref). The level of the reference voltage applied to the reference word lines RWL1 and RWL2 may be the same as, or different from, the level of the read voltage applied to the word line WLL. The sense amplifier 130 compares the read current (Iread) to the reference current (Iref) to sense a bit of data stored in the memory cell 210a. The sense amplifier 130 amplifies a level of the sensed bit of data and outputs the amplified bit of data, such that the bit of data stored in the memory cell 210a can be read therefrom.

For simplicity, assuming additional contributions to the resistance of the memory cell array 110 during reading of the memory cell 210 are small enough to be negligible, the read current (Iread) will be equal to the read voltage drop between the source line SL1 and the bit line BL1 divided by the resistance level of the memory cell 210, e.g. Iread-high=$V/(R_T+Rp)$ for the MTJ 240 in the parallel state and Iread-low=$V/(R_T+Rap)$ for the MTJ 240 in the anti-parallel state. The actual low and high read current (Iread) levels may vary due to location of the memory cell 210 within the memory cell array 110, temperature, parasitic capacitances, process variations in MTJs 240, and other manufacturing variations in components in the memory cell array 110 and the memory device 300. Therefore, each of the low and high read currents (Iread) for the memory cells 210 of the memory cell array 110 have a distribution of current levels. To the extent that the distributions of the low read current (Iread-low) and the high read current (Iread-high) do not overlap, e.g the highest "low read current" (Iread-low) corresponding to an MTJ 240 in the anti-parallel state is lower than the lowest "high read current" (Iread-high) corresponding to an MTJ 240 in the parallel state, the low and high read currents can be distinguished from each other by comparison to the reference current (Iref) designed to have a current level between the low and high read current distributions. To the extent that the reference read voltages applied to the reference source line RSL and the reference bit line RBL are the same as the voltages applied to source line SL1 and the bit line RBL1, the reference current (Iref) will be V/Rtot, where Rtot is the total resistance of the reference circuit 320. In some embodiments, the target reference current (Iref) level is mid-way between the low and high read current (Iread) levels, e.g. $V/(R_T+Rap/2+Rp/2)$, resulting in a target total resistance of the reference circuit 320 of Rtot=$R_T$+Rap/2+Rp/2. In some embodiments, the target reference current (Iref) level will be higher or lower than the mid-way level between the high and low read current (Iread) distributions, for example, due to differences in the distributions between the high and low read currents (Iread). In addition, in some embodiments the target resistance level of the reference circuit 320 may different from $R_T+Rap/2+Rp/2$ because a different voltage drop between the reference source line RSL and the reference bit line RBL is desired, e.g. to save power consumption of the reference circuit.

In some embodiments, the level of the read current (Iread) is similar to, or the same as, the switch current applied to a memory cell 210 resistive element 240, e.g. the current passed through the MTJ 240 from the free layer to the reference layer to switch the MTJ 240 from the anti-parallel state to the parallel state. In addition, the number of memory cells 210 included in a memory cell array 110 can number in the thousands (e.g. storing kilobits of data), or in the millions (e.g. storing megabits of data), or in the billions (e.g. storing gigabits of data) or more, and in some examples a reference current is necessary to execute a read operation for each of the thousands, or millions, or billions or more of memory cells 210. To prevent read disturb due to frequent read operations from undesirably switching the reference MTJs 340 and 360 from the anti-parallel state to the parallel state, the MTJs 340 and 360 can be inversely connected relative to a memory cell MTJ 240. For example, the MTJs 340 and 360 can be inversely connected such that during a read operation, the reference current (Iref) flows from the reference layer to the free layer of both the MTJs 340 and 360, which is the same direction of current flow through an MTJ to switch it from the parallel state to the anti-parallel state.

Figure 4:
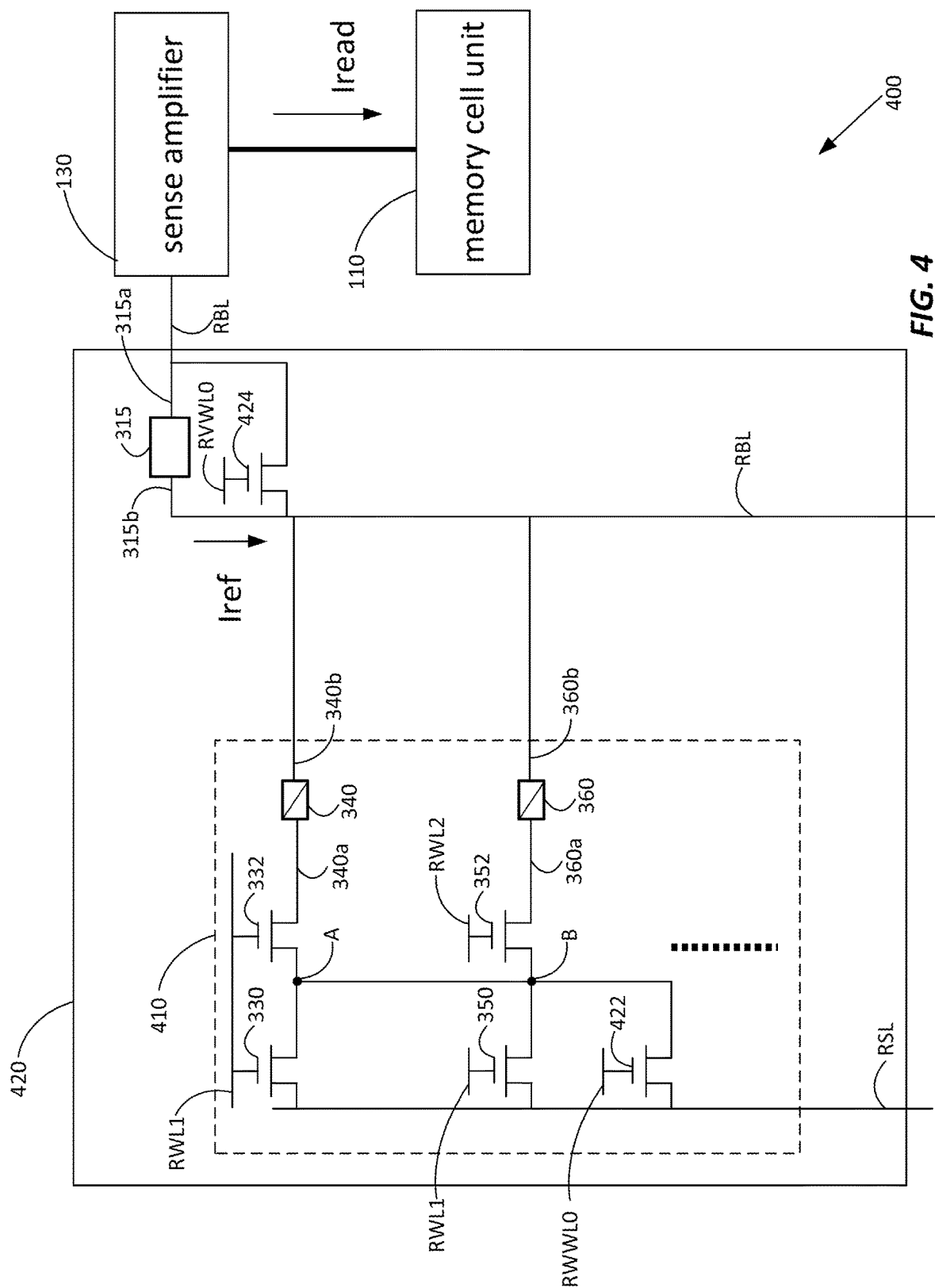
FIG. 4 is a circuit diagram illustrating another example reference circuit of a memory device in accordance with some embodiments.

FIG. 4 is a circuit diagram illustrating another example reference circuit 420 of a memory device 400 in accordance with some embodiments. In the example shown, the reference circuit 420 is similar to the reference circuit 320 and MTJ circuit 310 of FIG. 3, and further includes the device 422 and the device 424. In the embodiment shown, the device 422 and the device 424 are transistors, for example MOSFETs, although in other embodiments other types of transistors or devices can be used as the device 422 and the device 424 as well, for example, a switch or a set of switches.

In the embodiment shown, a first source/drain terminal of the device 422 is connected to the reference source line RSL. A second source/drain terminal is connected to the source/drain terminals of the transistors 330 and 332 at their junction, shown as the node A in the example, and is also connected to the sources/drains of the transistors 350 and 352 at their junction, shown as the node B in the example. The gate terminal of the device 422 is connected to a reference write word line RWWL0 that is different from the plurality of reference word lines, e.g. RWL1 and RWL2. Also in the embodiment shown, a first source/drain terminal of the device 424 is connected to the first terminal 315a of the resistor 315, and a second source/drain terminal of the device 424 is connected to the second terminal 315b of the resistor 315. The gate terminal of the device 424 is connected to the reference verify word line RVWL0. In the example shown, when the device 424 is activated, e.g. a voltage applied to the gate of the device 424, current bypasses the resistor 315, e.g. the device 424 can short the resistor 315.

In an example reference write operation, a voltage is applied between the reference source line RSL and the reference bit line RBL. Selective application of word line voltages to the reference word lines, e.g. RWL1 and RWL2, can operate to select individual MTJs 340 or 360 for application of a write current. The device 422 can operate to reduce the write current necessary for writing the resistance states of the MTJs 340 and 360. For example, to write the MTJ 360 to the anti-parallel state, a write voltage is applied between the reference source line RSL and the reference bit line RBL, a reference word line voltage is applied to the second reference word line RWL2 activating, e.g. "turning on" the transistor 352, a reference write word line voltage is applied to the reference write word line RWWL0 activating the device 422, and a voltage is not applied to, or is removed from, the first reference word line RWL1 deactivating, e.g. "turning off" the transistors 330, 332, and 350. The resulting current path flows from the reference source line RSL through the device 422, through the transistor 352, through the MTJ 360 to the reference bit line RBL. In some embodiments, the RBL is at 0 volts, e.g. grounded, during writing of the reference MTJs 340 and 360. Similarly, to write to the MTJ 340, a write voltage is applied between the reference source line RSL and the reference bit line RBL, a reference word line voltage is applied to the first reference word line RWL1 activating the transistors 330, 332, and 350, a reference write word line voltage is applied to the device 422, and a voltage is not applied to, or is removed from, the second reference word line RWL2, deactivating the transistor 352. The resulting current path flows from the reference source line RSL through any of the transistors 330, 350 or the device 422, through the transistor 332, and through the MTJ 340 to the reference bit line RBL. In some embodiments, the resistance of the device 422 is less than that of the transistors 330, 332, 350 and 352, enabling use of a lower reference write current.

In an exemplary reference verify operation, a voltage is applied between the reference source line RSL and the reference bit line RBL. Selective application of word line voltages to the reference word lines, e.g. RWL1 and RWL2, can operate to select individual MTJs 340 or 360 for application of a verify current. The devices 422 and 424 can operate to reduce the verify current necessary for verifying the resistance states of the MTJs 340 and 360. For example, to verify the resistance state of the MTJ 360, a verify voltage is applied between the reference source line RSL and the reference bit line RBL, a reference word line voltage is applied to the second reference word line RWL2 activating, e.g. "turning on" the transistor 352, a reference write word line voltage is applied to the reference write word line RWWL0 activating the device 422, a voltage is not applied to, or is removed from, the first reference word line RWL1 deactivating, e.g. "turning off" the transistors 330, 332, and 350, and a reference verify word line voltage is applied to the reference verify word line RVWL0 activating the device 424. The resulting current path flows from the reference source line RSL through the device 422, through the transistor 352, through the MTJ 360, and through the device 424, e.g. shorting around the resistor 315, and to the sense amplifier 130 for verification. Similarly, to verify the resistance state of the MTJ 340, a verify voltage is applied between the reference source line RSL and the reference bit line RBL, a reference word line voltage is applied to the first reference word line RWL1 activating the transistors 330, 332, and 350, a reference write word line voltage is applied to the device 422, a voltage is not applied to, or is removed from, the second reference word line RWL2, deactivating the transistor 352, and a reference verify word line voltage is applied to the device 422. The resulting current path flows from the reference source line RSL through any of the transistors 330, 350 or the device 422, through the transistor 332, through the MTJ 340, and through the device 424, e.g. shorting around the resistor 315, to the sense amplifier 130 for verification. In some embodiments, the resistance of the device 422 is less than that of the transistors 330, 332, 350 and 352, enabling use of a lower reference verify current. In some embodiments, verification of the resistance state of the MTJs 340 and 360 is done by a circuit other than the sense amplifier 130.

In some embodiments, during write operations the write voltage applied between the reference source line RSL and the reference bit line RBL causes a current to flow from the reference source line RSL to the reference bit line RBL, e.g. to switch the resistance state of a selected one of the MTJs 340 or 360 from the parallel state, e.g. Rp, to the anti-parallel state, e.g. Rap. In some embodiments, during write operations the write voltage applied between the reference source line RSL and the reference bit line RBL causes a current to flow from the reference bit line RBL to the reference source line RSL, e.g. to switch the resistance state of a selected one of the MTJs 340 or 360 from anti-parallel to parallel. In still some other embodiments, during verify operations a verify voltage is applied between the reference source line RSL and the reference bit line RBL, causing a current to flow either from the reference source line RSL to the reference bit line RBL or vice versa, e.g. to verify that the resistance state of a selected one of the MTJs 340 or 360 is either the parallel state, e.g. Rp, or the anti-parallel state, e.g. Rap.

Figure 5:
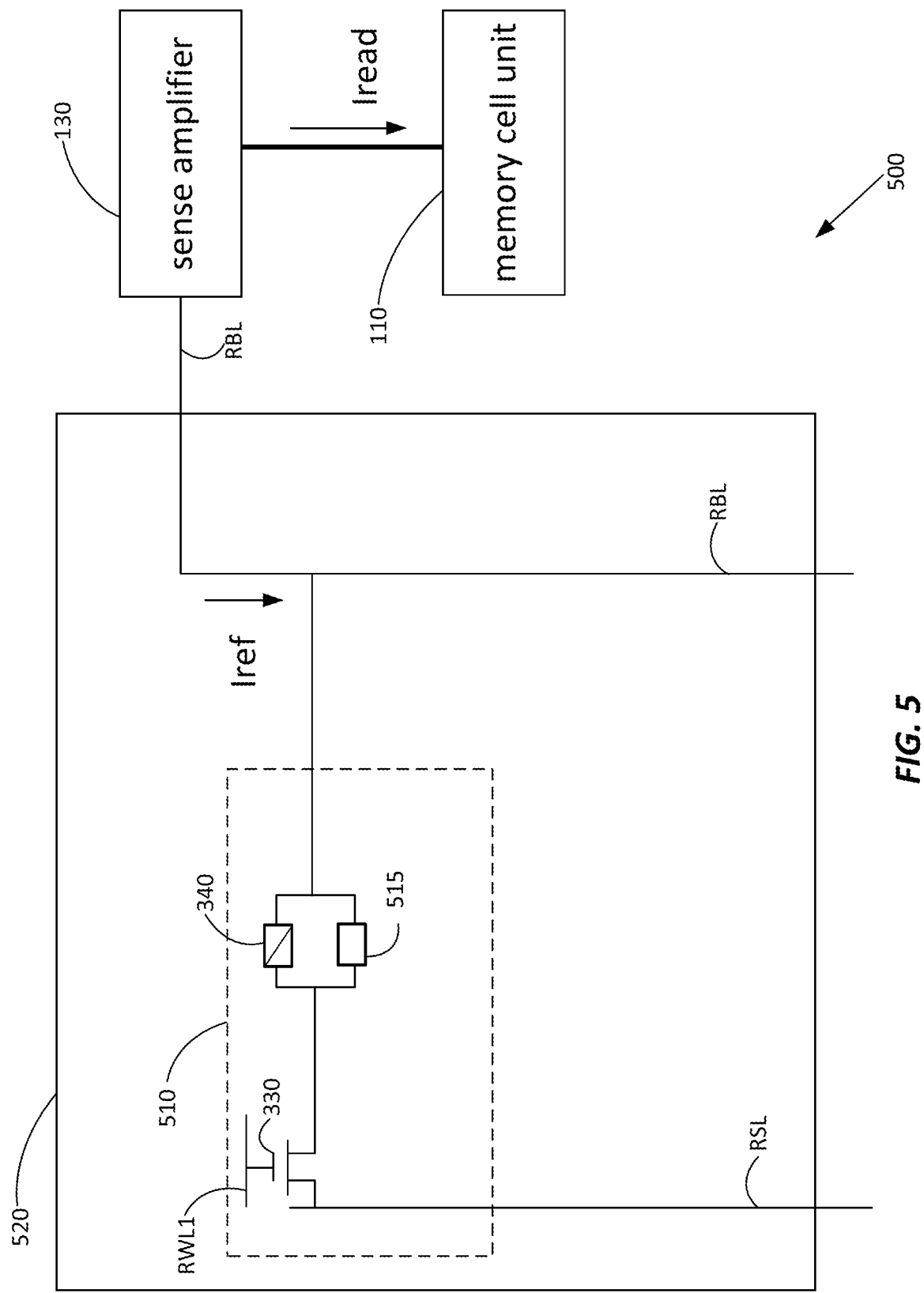
FIG. 5 is a circuit diagram illustrating another example reference circuit of a memory device in accordance with some embodiments.

FIG. 5 is a circuit diagram illustrating another example reference circuit 520 of a memory device 500 in accordance with some embodiments. The reference circuit 520 includes an MTJ circuit 510, a reference word line RWL1, a reference bit line RBL, and a reference source line RSL.

In the example shown, the MTJ circuit 510 includes the transistor 330, the resistive element 340, e.g. MTJ 340, and the resistor 515. The resistor 515 can be any type of appropriate resistive device, including a polysilicon resistor. The resistor 515 can have a different resistance level than the resistor 315, or can have the same resistance level as the resistor 315. In some embodiments, the reference circuit 520 includes a plurality of MTJ circuits 510.

In the embodiment shown, the transistor 330 has a first source/drain terminal connected to the reference source line RSL, a second source/drain terminal connected to a first terminal of the MTJ 340 and a first terminal of the resistor 515, and a gate terminal connected to the reference word line RWL1. The resistor 515 is connected in parallel with the MTJ 340, and each have a second terminal connected to the reference bit line RBL.

In an alternative embodiment, the memory device 500 does not include the reference source line RSL. In such an alternative embodiment, the first source/drain terminal of the transistor 330 can be connected to ground or other node of the memory device 500. The transistor 330 can be any type of transistor, including, e.g, a junction-type transistor, such as a BJT.

In the example shown, the MTJ 340 is of the same type as the MTJs 240 included in the memory cells 210 of the memory cell array 110 shown in FIG. 2. Further, the MTJ 340 is in an anti-parallel state as shown in FIG. 5. In the illustrated example, the resistance of the MTJ 340, e.g. Rap, and the resistance of the resistor 515, e.g. R, add in parallel. For example, the total resistance of the reference circuit 520 can be Rtotal=R_T+Rap*R/(Rap+R), where Rtotal is the total resistance of the reference circuit 520, R_T is the resistance of the transistor 330, Rap is the resistance of the MTJ 340, and R is the resistance of the resistor 515. In some embodiments, the resistance of the MTJ 340 can change with temperature and process variations in the same manner as the MTJs 240 of the memory cell array 110. As such, the reference MTJs 340 can track, or mimic, the resistance variations of the memory cell MTJs 240. The resistance of R can be chosen such that the reference circuit 520 generates a reference current (Iref) that is between the read current (Iread) generated by a stored "0" value versus a stored "1" value in the memory cells 210 of the memory cell array 110. In some embodiments, the MTJ 340 is inversely connected so as to prevent read disturb errors, as described above in reference to FIG. 3.

In an example read operation of the memory cell 210a of FIG. 2 using the reference circuit 520 shown in FIG. 5, read voltages are applied to the bit line BL1, the source line SL1, and the word line WL1 of the memory cell array 110. This activates the transistor 230 and a read current (Iread) flows through the memory cell 210a. In addition, reference read voltages are applied to the reference bit line RBL, the reference source line RSL, and reference word line voltages are applied to all of the reference word line of the reference circuit 520, e.g. RWL1 in the example shown. This activates the transistor 330, and the reference circuit 520 generates a reference current (Iref). The level of the reference voltage applied to the reference word lines RWL1 and RWL2 may be the same as, or different from, the level of the read voltage applied to the word line WI1. The sense amplifier 130 compares the read current (Iread) to the reference current (Iref) to sense a bit of data stored in the memory cell 210a. The sense amplifier 130 amplifies a level of the sensed bit of data and outputs the amplified bit of data, such that the bit of data stored in the memory cell 210a can be read therefrom.

Figure 6:
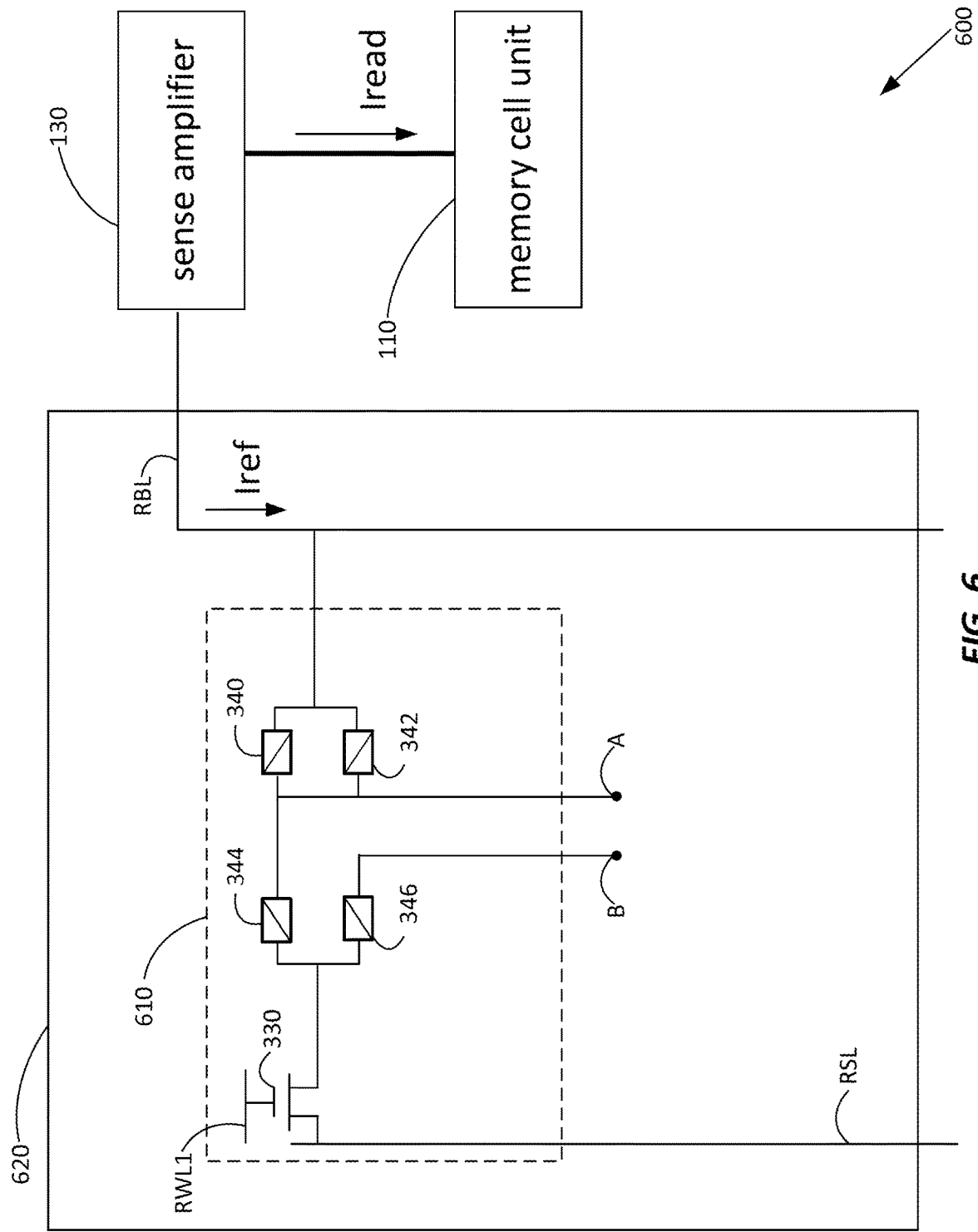
FIG. 6 is a circuit diagram illustrating another example reference circuit of a memory device in accordance with some embodiments.

FIG. 6 is a circuit diagram illustrating another example reference circuit 620 of a memory device 600 in accordance with some embodiments. The reference circuit 620 includes an MTJ circuit 610, a reference word line RWL1, a first voltage terminal 630, a second voltage terminal 632, a reference bit line RBL, and a reference source line RSL.

In the example shown, the MTJ circuit 610 includes the transistor 330 and the MTJs 340, 342, 344, and 346. The MTJs 340 and 342 are in the anti-parallel state having a high resistance, e.g. Rap, and the MTJs 344 and 346 are MTJs in the parallel state having a low resistance, e.g. Rp. In the embodiment shown, the transistor 330 has a first source/drain terminal connected to the reference source line RSL, a second source/drain terminal connected to the first terminals of the MTJs 344 and 346, and a gate terminal connected to the reference word line RWL1. The MTJ 346 has a second terminal connected to the second voltage terminal 632. In some embodiments, the second voltage terminal 632 is connected to a voltage source to selectively apply a voltage signal to the second voltage terminal 632. The MTJ 344 has a second terminal connected to the first terminals of the MTJs 340 and 342 and the first voltage terminal 630. In some embodiments, the first voltage terminal 630 is connected to a voltage source to selectively apply a voltage signal to the first voltage terminal 630. The MTJs 340 and 342 each have a second terminal connected to the reference bit line RBL.

In an alternative embodiment, the memory device 600 does not include the reference source line RSL. In such an alternative embodiment, the first source/drain terminal of the transistor 330 can be connected to ground or other node of the memory device 600. The transistor 330 can be any type of transistor, including, e.g., a junction-type transistor, such as a BJT.

In the example shown, the MTJs 340, 342, 344, and 346 are of the same type as the MTJs 240 included in the memory cells 210 of the memory cell array 110. Further, the MTJs 340 and 342 are in an anti-parallel state having a resistance of Rap, and the MTJs 344 and 346 are in the parallel state having a resistance of Rp. In some embodiments, the first voltage terminal 630 and the second voltage terminal 632 can be connected, e.g. "shorted," and as a result, the pair of the MTJs 344 and 346 in the parallel state are connected in parallel with each other, and in series with both the transistor 330 and the pair of MTJs 340 and 342 in the anti-parallel state, which are also connected in parallel with each other. As such, the total resistance of the reference circuit 620 is Rtot=$R_T$+Rap/2+Rp/2, corresponding to a target total resistance for the reference circuit 620 in some embodiments, as described above in reference to FIG. 3. In some embodiments, the MTJs 340 and 342 are inversely connected so as to prevent read disturb errors, as described above in reference to FIG. 3. In some embodiments, the resistance of the MTJs 340, 342, 344, and 346 can change with temperature and process variations in the same manner as the MTJs 240 of the memory cell array 110. As such, the reference MTJs 340, 342, 344, and 346 can track, or mimic, the resistance variations of the memory cell MTJs 240.

In an exemplary read operation of the memory cell 210a using the reference circuit 620, read voltages are applied to the bit line BL1, the source line SL1, and the word line WL1 of the memory cell array 110. This activates the transistor 230 and a read current (Iread) flows through the memory cell 210a. In addition, reference read voltages are applied to the reference bit line RBL and the reference source line RSL, the nodes A and B can be connected, and a reference word line voltage can be applied to the reference word line RWL1 of the reference circuit 620. This activates the transistor 330, and the reference circuit 620 generates a reference current (Iref). The level of the reference word line voltage applied to the reference word line RWL1 may be the same as, or different from, the level of the read word line voltage applied to the word line WL1. The sense amplifier 130 compares the read current (Iread) to the reference current (Iref) to sense a bit of data stored in the memory cell 210a. The sense amplifier 130 amplifies a level of the sensed bit of data and outputs the amplified bit of data, such that the bit of data stored in the memory cell 210a can be read therefrom.

In an exemplary reference write operation, both the MTJs 340 and 342 can be written to the anti-parallel state by applying voltage levels to the reference bit line RBL and the first voltage terminal 630. In an additional exemplary reference write operation, the MTJ 344 can be written the parallel state by applying voltage levels to the reference source line RSL and the first voltage terminal 630, and a word line voltage to the reference word line RWL1 to activate the transistor 330. In still another additional exemplary reference write operation, the MTJ 346 can be written the parallel state by applying voltage levels to the reference source line RSL and the second voltage terminal 632, and a word line voltage to the reference word line RWL1 to activate the transistor 330.

Figure 7:
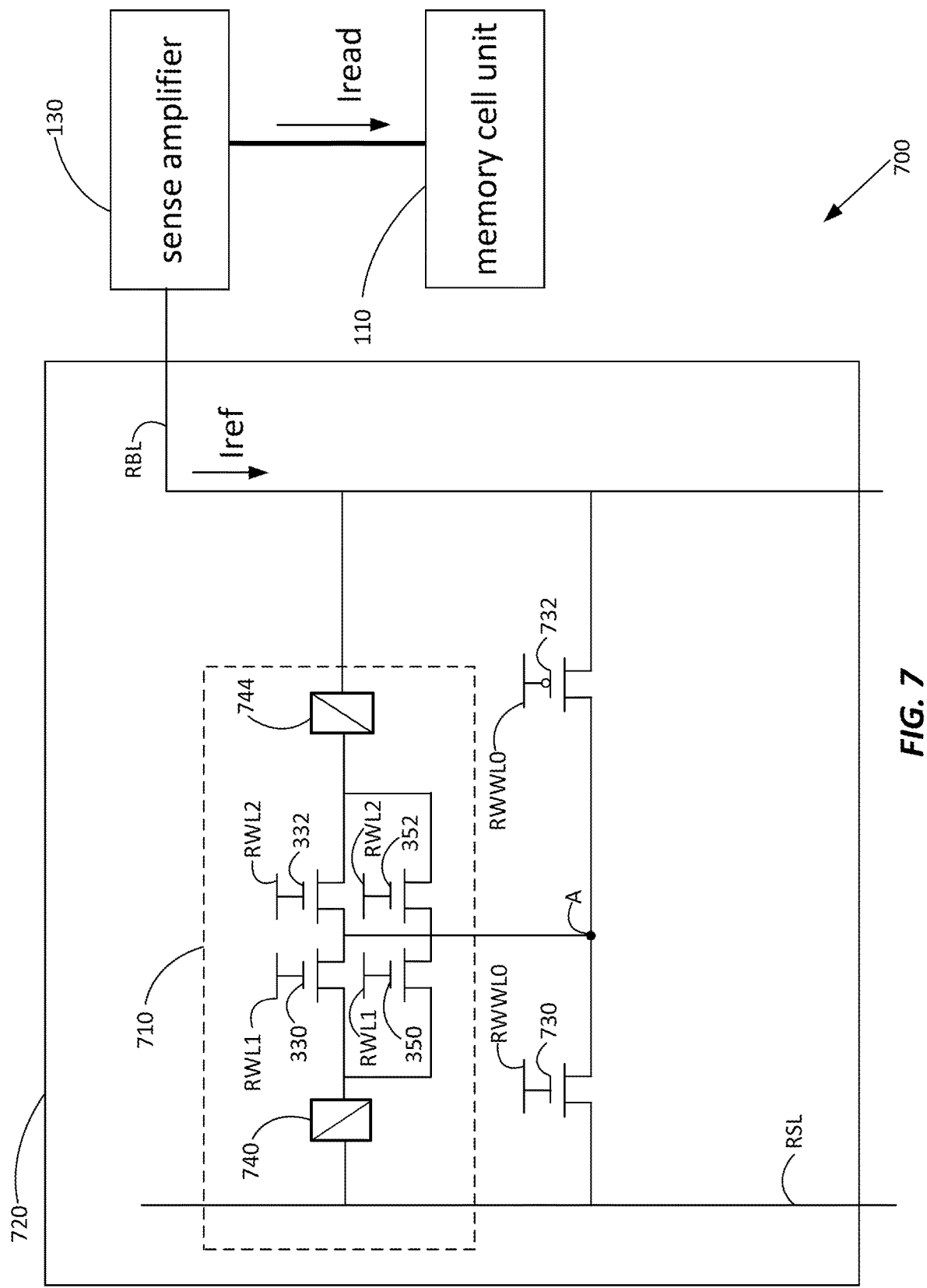
FIG. 7 is a circuit diagram illustrating another example reference circuit of a memory device in accordance with some embodiments.

FIG. 7 is a circuit diagram illustrating another example reference circuit 720 of a memory device 700 in accordance with some embodiments. The reference circuit 720 includes an MTJ circuit 710, a reference word line RWL1, a reference word line RWL2, an NMOS transistor 730, a PMOS transistor 732, a reference write word line RWWL0, a reference bit line RBL, and a reference source line RSL.

In the example shown, the MTJ circuit 710 includes the transistors 330, 332, 350, and 352, and the MTJs 740 and 744. The MTJs 740 and 744 larger than the memory cell MTJs 240, for example the magnetic layers and the insulating film of the MTJs 740 and 744 have twice the area of the magnetic layers and insulating film of the MTJs 240. The MTJ 740 is in the anti-parallel state, and the MTJ 744 is in the parallel state. The larger MTJs 740 and 744 can have a reduced resistance as compared with the MTJs 240, for example the MTJ 740 in the anti-parallel state can have a resistance of Rap/2 and the MTJ 744 in the parallel state can have a resistance of Rp/2.

In the embodiment shown, the MTJ 740 has a first terminal connected to the reference source line RSL. The transistors 330 and 350 are connected in parallel and each has a first source/drain terminal connected to a second terminal of the MTJ 740, a second source/drain terminal connected to a voltage terminal 750, and a gate terminal connected to a first reference word line RWL1. The transistors 332 and 352 are connected in parallel and each has a first source/drain terminal connected to the second source/drain terminals of the transistors 330 and 350 and the voltage terminal 750, a second source/drain terminal connected to a first terminal of the MTJ 744, and a gate terminal connected to a second reference word line RWL2. The MTJ 744 has a second terminal connected to the reference bit line RBL. In addition, the transistor 730 has a first source/drain terminal connected to the reference source line RSL, a second source drain terminal connected to the voltage terminal 750 and a first source/drain terminal of the transistor 732, and a gate terminal connected to a reference write word line RWWL0. The transistor 732 has a second source/drain terminal connected to the reference bit line RBL and a gate terminal connected to the reference write word line RWWL0. In some embodiments, the voltage terminal 750 can be connected to further circuitry (not shown) to control the voltage applied to the voltage terminal 750.

In an alternative embodiment, the memory device 700 does not include the reference source line RSL. In such an alternative embodiment, the first source/drain terminal of the transistor 730 and the first terminal of the MTJ 740 can be connected to ground or other node of the memory device 700. The transistors 330, 332, 350, 352, 730, and 732 can be any type of transistor, including, e.g., a junction-type transistor, such as a BJT.

In the embodiment shown, the MTJ 740 is connected in series with the pair of transistors 330 and 350, the pair of transistors 332 and 352, and the MTJ 744. The pair of transistors 330 and 350 are connected in parallel with each other, as are the pair of transistors 332 and 352. As described above with reference to FIG. 3, the transistors 330, 332, 350, and 352 connected as described can mimic the resistance of each one of the transistors 330, 332, 350 and 352 individually, e.g. $R_T$. As such, the total resistance of the reference circuit 720 is Rtot=$R_T$+Rap/2+Rp/2, corresponding to a target total resistance for the reference circuit 720 in some embodiments, as described above in reference to FIG. 3. In some embodiments, the larger MTJs 740 and 744 have increase resistance state retention stability, and in addition are significantly less susceptible to read disturb errors, e.g. changes in resistance state due to read disturb. In some embodiments, the larger MTJs 740 and 744 are read disturb free. In some embodiments, the resistance of the MTJs 740 and 744 can change with temperature and process variations in the same manner as the MTJs 240 of the memory cell array 110. As such, the reference MTJs 740 and 744 can track, or mimic, the resistance variations of the memory cell MTJs 240. In some embodiments, the larger MTJs 740 and 744 are easier to implement in an integrated circuit including the memory device 700 as compared with the MTJs 340, 342, 344, and 346.

In an exemplary read operation of the memory cell 210a using the reference circuit 720, read voltages are applied to the bit line BL1, the source line SL1, and the word line WL1 of the memory cell array 110. This activates the transistor 230 and a read current (Iread) flows through the memory cell 210a. In addition, reference read voltages are applied to the reference bit line RBL and the reference source line RSL and a reference word line voltages can be applied to the reference word lines RWL1 and RWL2 of the reference circuit 720. This activates the transistors 330, 332, 350, and 352, and the reference circuit 720 generates a reference current (Iref). The level of the reference word line voltages applied to the reference word lines RWL1 and RWL2 may be the same as, or different from, each other as well as the level of the read word line voltage applied to the word line WL1. The sense amplifier 130 compares the read current (Iread) to the reference current (Iref) to sense a bit of data stored in the memory cell 210a. The sense amplifier 130 amplifies a level of the sensed bit of data and outputs the amplified bit of data, such that the bit of data stored in the memory cell 210a can be read therefrom.

In an exemplary reference write operation, the MTJ 740 can be written to the anti-parallel state by applying voltage levels to the reference source line RSL and the node A and applying a word line voltage to the reference word line RWL1 to activate the transistors 330 and 350. In an additional exemplary reference write operation, the MTJ 744 can be written to the parallel state by applying voltage levels to the reference bit line RBL and the node A and applying a word line voltage to the reference word line RWL2 to activate the transistors 332 and 352. In some embodiments, the voltage is applied to the node A by additional circuitry (not shown). In other embodiments, the voltage is supplied to the node A by either the reference source line RSL or the reference bit line RBL via the transistors 730 and 732. For example, during reference write operations for the MTJ 744, a "high" reference write word line voltage is applied to the reference write word line RWWL0 activating the NMOS transistor 730 and deactivating the PMOS transistor 732. Similarly, during reference write operations for the MTJ 740, a "low" reference write word line voltage is applied to the reference write word line RWWL0 deactivating the NMOS transistor 730 and activating the PMOS transistor 732.

Figure 8:
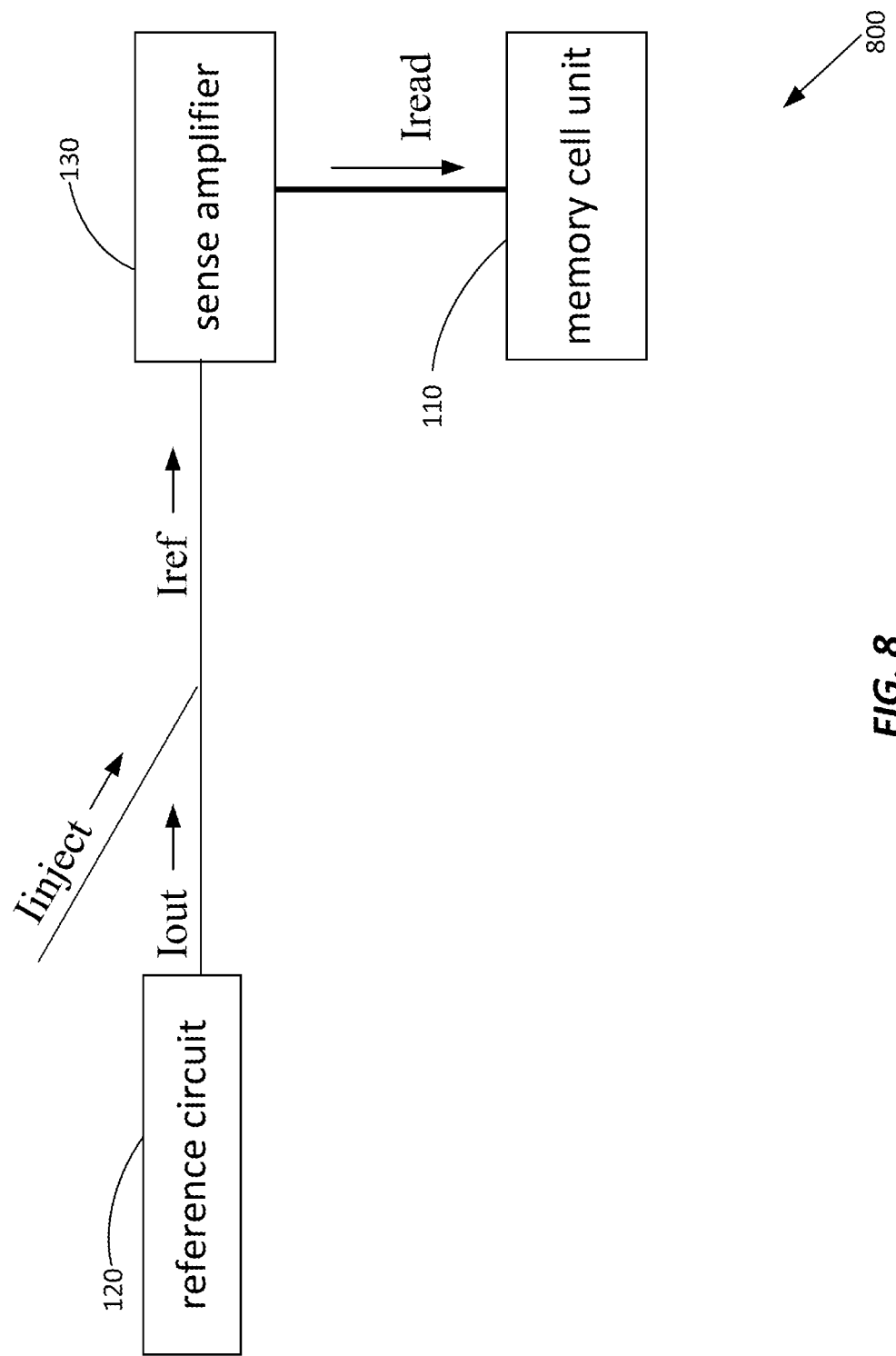
FIG. 8 is a block diagram illustrating another example memory device in accordance with some embodiments.

FIG. 8 is a block diagram illustrating another example memory device 800 in accordance with some embodiments. The memory device 800 includes a memory cell array 110, a reference circuit 120, and a sense amplifier 130, and is similar to the memory device 100 described above with reference to FIG. 1.

Figure 9:
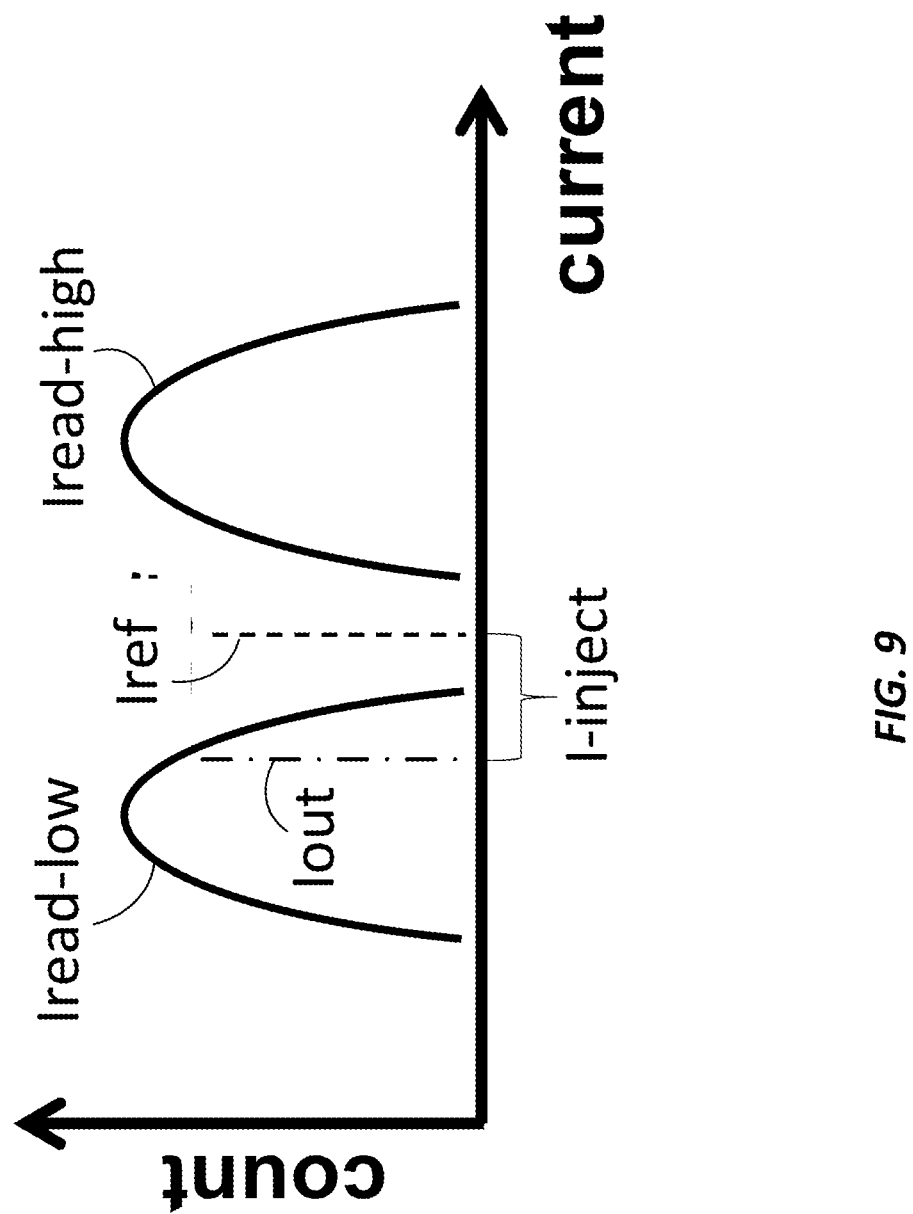
FIG. 9 is a plot of an example reference current and read current distributions.

In an example read operation of the memory device 800, read voltages are applied to the memory device 800, whereby a read current (Iread) flows between the memory cell array 110 and the sense amplifier 130 and a reference output current (Iout) flows from the reference circuit 120. In the example shown, the reference circuit can be any reference circuit, including the reference circuits 120, 320, 420, 520, 620, 720, or any other reference circuit. An injection current (Iinject) is combined with the reference output current (Iout) to increase or decrease the reference current (Iref) flowing between the reference circuit 120 and the sense amplifier 130. The level of the injection current (Iinject) is based on the level needed to make the level of the reference current (Iret) be between the low and high read currents (Iread-low and Iread-high) flowing between the memory cell array 110 and the sense amplifier 130, as shown in the example illustrated in FIG. 9. As described above with reference to FIG. 3, the high and low read currents (Iread-low and Iread-high) from the memory cell array 110 will be distributions. In some embodiments, the reference output current (Iout) from the reference circuit 120 will not be between the high and low distributions and will be either too low, as illustrated in FIG. 9, or too high (not shown). In such embodiments, use of the output current (Iout) as the reference current (Iref) results in erroneous readouts. For example, as illustrated in FIG. 9 the output current (Iout) is too low such that it is at a current level within the low read current distribution (Iread-low). As such, at least some of the low read currents read from at least some of the memory cells 210 of the memory cell array 110 will be greater than the output current (Iout) and will erroneously be read as the wrong bit, e.g. corresponding an MTJ 240 in a parallel state when the MTJ 240 was actually in an anti-parallel state. Therefore, in some embodiments, an injection current (Iinject) is combined with the reference output current (Iout) to either raise it, as illustrated in FIG. 9, or lower it (not shown) to the desired target reference current (Iref) level that is between the low and high read current distributions such that sufficient read margin can be achieved during comparison of the read current (Iread) and the reference current (Iret) by the sense amplifier 130.

Figure 10:
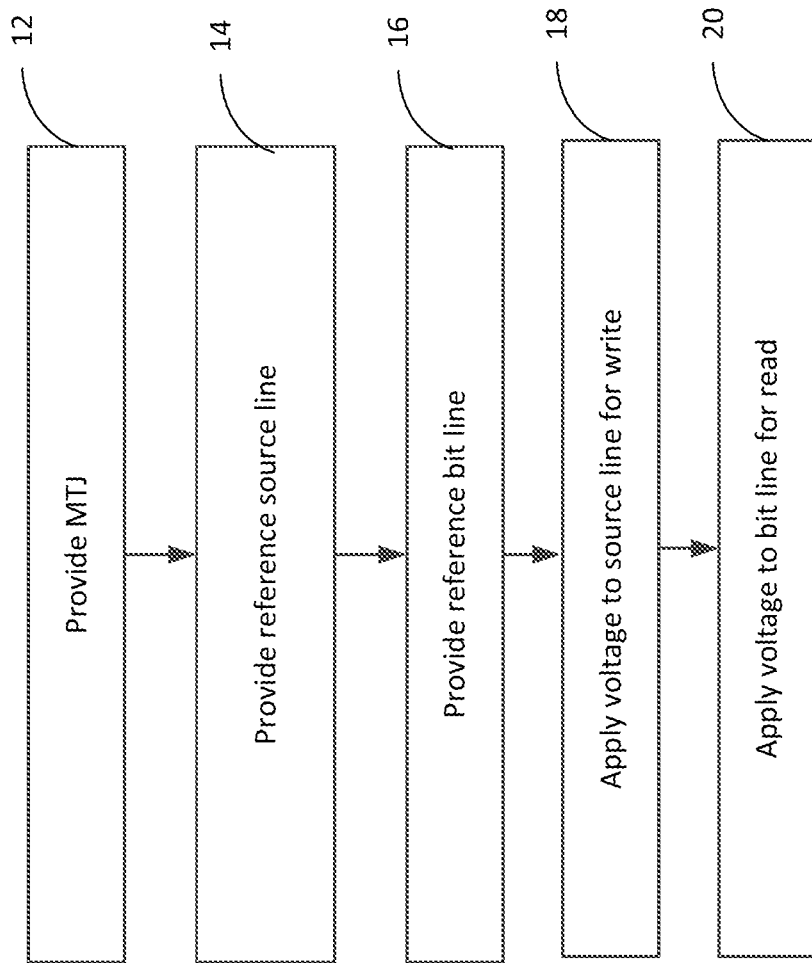
FIG. 10 is a flowchart of a method for generating a reference current in accordance with some embodiments

FIG. 10 illustrates an example of a method for generating a reference current, such as the reference current (Iref) coupled to the sense amplifier 130 from a reference circuit. A reference circuit, such as the reference circuit 320 is initially provided. More particularly, in the illustrated example, at least one MTJ is provided in an operation 12. In an operation 14, a reference source line RSL is provided, and a reference bit line RBL coupled to a sense amplifier 130 is provided in an operation 16. In some embodiments, two MTJs are provided, such as the MTJs 340, 360, which have terminals 340b, 360b connected to the reference bit line RBL, and terminals 340a, 360a connected to the reference source line.

In an operation 18, a voltage signal is applied to the source line RSL to generate a current flow from the reference source line RSL, through the MTJ(s) 340 and/or 360 to the reference bit line RBL. In an operation 20, a voltage signal is applied to the reference bit line RBL to generate a current flow from the reference bit line RBL, through the MTJ(s) 340 and/or 360 to the source line RSL.

Accordingly, the various embodiments disclosed herein provide a low-current reference circuit for a memory device. The various embodiments disclosed herein also provide a reference current that can track, or mimic, read current variations due to temperature and process variations in manufacture of memory cell components. For example, embodiments disclosed herein provide for a reference current generated by a reference circuit including MTJs of similar type as are used in a memory unit for which the reference current is used during read operations of the memory unit. As such, the various embodiments disclosed provide for a reference current that can be used to distinguish between the two binary states of a memory cell unit during read operations, for example a reference current that is between the current level distributions for read currents used to read data stored in memory as low and high resistance states.

The various embodiments disclosed herein also provide a reference current generated by a reference circuit including MTJs that can be inversely connected, thereby increasing the reliability of the generated reference current by preventing read disturb of the MTJs included in the reference circuit.

The various embodiments disclosed herein also provide a reference circuit enabling individual writing of MTJs to the anti-parallel state, resulting in a low-current reference generating reference circuit. For example, a reference circuit including four transistors arranged as pairs of transistors connected in parallel allow for individual writing of reference circuit MTJs while having the equivalent resistance of a single transistor when generating a reference current for read operations of a memory cell unit.

The various embodiments disclosed herein also provide a reference circuit enabling lower write and verification currents to be used when writing the MTJs of the reference circuit. For example, devices shorting around transistors and resistors or resistors during reference write or reference verification operations, thereby reducing write and verify path resistance, are disclosed.

In addition, the various embodiments disclosed herein also provide a reference circuit including components, e.g. MTJs, that are read disturb free and have increased resistance state retention reliability, and are easier to implement in a memory device included in an integrated circuit.

In some disclosed examples, a reference circuit for generating a reference current includes a plurality of resistive elements including at least one MTJ. A control circuit is coupled to a first terminal of the at least one MTJ and is configured to selectively flow current through the at least one MTJ in the forward and inverse direction to generate a reference current. A source line is coupled to the control circuit, and a bit line is coupled to a second terminal of the at least one MTJ and is configured to provide the reference current to a sense amplifier.

Additional examples include a memory device, such as an MRAM device, include a memory array with a plurality of memory cells. A sense amplifier is connected to the memory array, and a reference bit line is configured to provide a reference current to the sense amplifier. A plurality of resistive elements include at least one MTJ coupled to the reference bit line. A first pair of transistors are connected in parallel, and a second pair of transistors are connected in parallel. The first and second pairs of transistors are connected in series between the at least one MTJ and a reference source line.

In accordance with still further examples, a method of generating a reference current is disclosed. At least one MTJ is provided, as well as a reference source line and a reference bit line that is coupled to a sense amplifier. A first voltage signal is to the reference source line to generate a current flow from the reference source line, through the at least one MTJ to the bit line. A second voltage signal is applied to the reference bit line to generate a current flow from the reference bit line, through the at least one MTJ to the reference source line.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array including a plurality of memory cells;
   a sense amplifier connected to the memory array;
   a reference bit line configured to provide a reference current to the sense amplifier;
   a plurality of resistive elements including at least one magnetic tunnel junction (MTJ) coupled to the reference bit line;
   a first pair of transistors connected in parallel;
   a second pair of transistors connected in parallel; and
   the first and second pairs of transistors connected in series between the at least one MTJ and a reference source line wherein the first and second pairs of transistors are configured to selectively flow current through the at least one MTJ in the forward and inverse direction to generate the reference current wherein the first pair of transistors includes first and second transistors connected in parallel, and the second pair of transistors includes third and fourth transistors connected in parallel, and wherein the first, second and third transistors each have a gate terminal connected to a first reference word line, and the fourth transistor has a gate terminal connected to as second reference word line.

2. The memory device of claim 1, wherein at least one MTJ is in a high resistance state.

3. The memory device of claim 1, wherein the plurality of resistive elements includes a resistor connected in parallel with the at least one MTJ between a control circuit and the reference bit line.

4. The memory device of claim 1, wherein the plurality of resistive elements includes a resistor connected to the bit line between the sense amplifier and the at least one MTJ.

5. A memory device, comprising:
   a sense amplifier connected to a memory array;
   a reference bit line configured to provide a reference current to the sense amplifier;
   a plurality of resistive elements including at least one magnetic tunnel junction (MTJ) coupled to the reference bit line wherein the plurality of resistive elements includes a resistor connected in parallel with the at least one MTJ between a control circuit and the reference bit line;
   a first pair of transistors connected in parallel;
   a second pair of transistors connected in parallel; and
   the first and second pairs of transistors connected in series between the at least one MTJ and a reference source line wherein the first and second pairs of transistors are configured to selectively flow current through the at least one MTJ in the forward and inverse direction to generate the reference current wherein the first pair of transistors includes first and second transistors connected in parallel, and the second pair of transistors includes third and fourth transistors connected in parallel.

6. The memory device of claim 5, wherein at least one MTJ is in a high resistance state.

7. The memory device of claim 5, wherein the plurality of resistive elements includes a resistor connected to the bit line between the sense amplifier and the at least one MTJ.

8. The memory device of claim 5, wherein the memory array including a plurality of memory cells.

9. The memory device of claim 5, wherein the first transistor has a gate terminal connected to a first reference word line.

10. A memory device, comprising:
    a sense amplifier connected to a memory array;
    a reference bit line configured to provide a reference current to the sense amplifier;
    a plurality of resistive elements including at least one magnetic tunnel junction (MTJ) coupled to the reference bit line wherein the plurality of resistive elements includes a resistor connected to the bit line between the sense amplifier and the at least one MTJ;

a first pair of transistors connected in parallel;

a second pair of transistors connected in parallel; and the first and second pairs of transistors connected in series between the at least one MTJ and a reference source line wherein the first and second pairs of transistors are configured to selectively flow current through the at least one MTJ in the forward and inverse direction to generate the reference current wherein the first pair of transistors includes first and second transistors connected in parallel, and the second pair of transistors includes third and fourth transistors connected in parallel.

11. The memory device of claim 10, wherein at least one MTJ is in a high resistance state.

12. The memory device of claim 10, wherein the plurality of resistive elements includes a resistor connected in parallel with the at least one MTJ between a control circuit and the reference bit line.

13. The memory device of claim 10, wherein the memory array including a plurality of memory cells.

14. The memory device of claim 10, wherein the first transistor has a gate terminal connected to a first reference word line.

15. The memory device of claim 5, wherein the second transistor has a gate terminal connected to a first reference word line.

16. The memory device of claim 5, wherein the third transistor has a gate terminal connected to a first reference word line.

17. The memory device of claim 5, wherein the fourth transistor has a gate terminal connected to a second reference word line.

18. The memory device of claim 10, wherein the second transistor has a gate terminal connected to a first reference word line.

19. The memory device of claim 10, wherein the third transistor has a gate terminal connected to a first reference word line.

20. The memory device of claim 10, wherein the fourth transistor has a gate terminal connected to a second reference word line.

* * * * *